(12) United States Patent
Müller et al.

(10) Patent No.: US 9,789,830 B2
(45) Date of Patent: Oct. 17, 2017

(54) ENERGY SUPPLY CIRCUIT FOR ELECTRIC COMPONENTS

(71) Applicant: MARQUARDT GMBH, Rietheim-Weilheim (DE)

(72) Inventors: Karl Müller, Rottweil-Neufra (DE); Matthias Reckermann, Tuttlingen (DE)

(73) Assignee: Marquardt GmbH, Rietheim-Weilheim (DE)

( * ) Notice: Subject to any disclaimer, the term of this patent is extended or adjusted under 35 U.S.C. 154(b) by 620 days.

(21) Appl. No.: 14/163,369

(22) Filed: Jan. 24, 2014

(65) Prior Publication Data

US 2014/0152091 A1   Jun. 5, 2014

(30) Foreign Application Priority Data

Jul. 27, 2011   (DE) .......................... 10 2011 108 577

(51) Int. Cl.
| | | |
|---|---|---|
| *B60R 16/033* | (2006.01) | |
| *B60R 25/40* | (2013.01) | |
| *G07C 9/00* | (2006.01) | |
| *H01M 10/48* | (2006.01) | |
| *H02J 9/00* | (2006.01) | |
| *G01R 31/36* | (2006.01) | |

(52) U.S. Cl.
CPC .......... *B60R 16/033* (2013.01); *B60R 25/403* (2013.01); *G07C 9/00174* (2013.01); *H01M 10/48* (2013.01); *H02J 9/002* (2013.01); *G01R 31/3693* (2013.01); *G07C 2009/00634* (2013.01); *H01M 2220/20* (2013.01)

(58) Field of Classification Search
CPC .......... E05B 81/54; E05B 81/56; E05B 81/80; B60R 16/033; B60R 25/04
See application file for complete search history.

(56) References Cited

U.S. PATENT DOCUMENTS

| | | |
|---|---|---|
| 5,191,500 A | 3/1993 | Hatano et al. |
| 5,576,686 A | 11/1996 | Westermeir et al. |
| 5,841,363 A | 11/1998 | Jakob et al. |
| 6,806,588 B2 * | 10/2004 | Amano ............ B60L 11/14 307/10.7 |
| 2004/0196141 A1 | 10/2004 | Yoshida et al. |

(Continued)

FOREIGN PATENT DOCUMENTS

| | | |
|---|---|---|
| DE | 43 40 260 A1 | 4/1995 |
| DE | 43 37 274 A1 | 5/1995 |

(Continued)

OTHER PUBLICATIONS

German Search Report (Application No. 10 2011 108 577.0) dated Mar. 12, 2012.

(Continued)

*Primary Examiner* — Jeffrey Shin
(74) *Attorney, Agent, or Firm* — Burr & Brown, PLLC

(57) ABSTRACT

The invention relates to an energy supply circuit of electric components, in particular for a motor vehicle, having an accumulator, wherein a discharge monitoring circuit monitors the energy stored in the accumulator. If the energy stored in the accumulator falls below a threshold value, the discharge monitoring circuit switches off the energy supply at least of individual components, in particular of all components.

15 Claims, 3 Drawing Sheets

(56) References Cited

U.S. PATENT DOCUMENTS

| | | | |
|---|---|---|---|
| 2006/0261843 A1 | 11/2006 | Kraft et al. | |
| 2006/0279467 A1* | 12/2006 | LeMense | H01Q 1/3241 |
| | | | 343/711 |
| 2007/0188150 A1 | 8/2007 | Yamaguchi et al. | |
| 2010/0082198 A1 | 4/2010 | Arai et al. | |
| 2011/0127830 A1 | 6/2011 | Harding | |

FOREIGN PATENT DOCUMENTS

| | | |
|---|---|---|
| DE | 198 38 248 A1 | 3/2000 |
| DE | 199 52 112 A1 | 6/2001 |
| DE | 103 11 396 A1 | 9/2004 |
| DE | 10 2004 013 080 A1 | 10/2004 |
| DE | 10 2005 046 340 A1 | 4/2007 |
| DE | 10 2008 010 819 A1 | 1/2009 |
| DE | 10 2009 058 362 A1 | 6/2011 |
| EP | 2 284 052 A2 | 2/2011 |
| JP | 2006-080002 A1 | 3/2006 |
| JP | 2007-176320 A1 | 7/2007 |
| JP | 2007-216838 A1 | 8/2007 |
| JP | 2010-076595 A1 | 4/2010 |
| JP | 2011-059931 A1 | 3/2011 |

OTHER PUBLICATIONS

International Search Report and Written Opinion (Application No. PCT/EP2012/003162) dated Nov. 30, 2012.
Japanese Office Action (Application No. 2014-521990) dated Jun. 14, 2016 (with English translation).

* cited by examiner

ENERGY SUPPLY CIRCUIT FOR ELECTRIC COMPONENTS

CROSS REFERENCE TO RELATED APPLICATIONS

This application is a continuation of International Application No. PCT/EP2012/003162 filed Jul. 26, 2012, which designated the United States, and claims the benefit under 35 USC §119(a)-(d) of German Application No. 10 2011 108 577.0 filed Jul. 27, 2011, the entireties of which are incorporated herein by reference.

FIELD OF THE INVENTION

The present invention relates to an energy supply circuit for electric components.

BACKGROUND OF THE INVENTION

Such an energy supply circuit can be used in particular in a motor vehicle for the current and/or voltage supply of control units.

Current and/or voltage supply circuits for electric components have already become known in various systems. Such current and/or voltage supply circuits in the motor vehicle frequently include an accumulator or a battery and are adapted to the individual requirements of the particular electric component to be supplied. In the event of malfunctions, the accumulator may become completely discharged, causing the motor vehicle to become incapable of functioning.

SUMMARY OF THE INVENTION

The object of the present invention is to refine the energy supply circuit in such a way that at least emergency operation is made possible.

A discharge monitoring circuit is provided with the energy supply circuit according to the present invention, which monitors the energy stored in the accumulator. If the energy stored in the accumulator falls below a threshold value, the discharge monitoring circuit switches off the energy supply at least of individual components. If it is advantageous, the energy supply of all associated components may also be switched off. A complete discharge of the accumulator is thus advantageously avoided, so that residual energy is still available, which may then be used for emergency operation. The reliability of the motor vehicle is accordingly increased with the aid of the energy supply according to the present invention. Of course, the discharge monitoring circuit is able to indicate the emergency situation to the driver of the motor vehicle, so that the driver is able to search for a garage with the aid of emergency operation.

Depending on the type of emergency operation, it may be expedient to provide the residual energy contained in the accumulator to a specific component upon request. Such a mode for emergency operation is particularly suitable for a motor vehicle having a locking system, in particular for access and/or driving authorization. The locking system comprises a first device designed as a control device having at least two states, such as a control device for unlocking and/or locking the car doors, the ignition lock, the steering wheel lock, for enabling and/or disabling the immobilizer, the engine control unit, or the like; and an associated second device designed as a kind of an electronic key, an ID transmitter, a chip card, or the like. The two devices have transmitters and/or receivers for their normal operation, in particular for electromagnetic signals. At least one of the signals transmitted between the second device and the first device may be an encoded operating signal for authentication of the second device, so that a change of the state of the first device can be brought about after a positive evaluation of the transmitted operating signal if the second device is authorized. The first device is supplied with energy from the accumulator for normal operation. The component to which the residual energy is provided is a component of the locking system, in particular of the first device.

It is particularly preferred in this embodiment that the component of the first device that is supplied with the residual energy is the module for the driving authorization system and/or for the access authorization system, the so-called driving authorization system module, which is in particular located in the door for the door lock. The second device, i.e., the electronic key, may then be activated using at least a portion of the residual energy via the driving authorization system module with the aid of a transponder. The coil of the transponder may be placed in a simple manner in the door handle on the door or at another location in the exterior area of the motor vehicle. This embodiment thus eliminates the previously existing mechanical lock in the door for emergency opening, because the residual energy is generally sufficient for multiple opening procedures. Since no expensive mechanical lock is required, the cost-effectiveness is also increased via this approach. In addition, theft protection is also enhanced, since a mechanical lock provides a lower level of security in this respect.

At least a portion of the residual energy may also be connected for operating the vehicle electronics. A separate activation unit provides this in a simple manner. It is thus advantageously possible to carry out at least one starting procedure or even multiple starting procedures for the motor vehicle. Emergency starting is thus made possible for the motor vehicle in a cost-effective manner. The component of the first device that is supplied with the residual energy may be the control unit for the driving authorization system, the so-called driving authorization system control unit. In this case, the second device, i.e., the key, may be activated using the residual energy via the driving authorization system control unit with the aid of a transponder. The coil of the transponder may be placed in the dashboard or at another location in the interior area of the motor vehicle in a simple and cost-effective manner, providing the driver with simple and accessible operation.

In order to have sufficient residual energy available in an operationally reliable manner, the accumulator may be a lithium-ion battery.

The advantages achieved using the present invention include in particular that emergency operation is made possible in a simple manner. Since emergency operation requires no additional components, for example, an emergency battery, no additional costs are incurred. On the contrary, additional components previously required only for emergency operation, such as a mechanical door lock, may be eliminated. Additional cost savings are thus also made possible. The present invention therefore increases reliability in a cost-effective manner.

BRIEF DESCRIPTION OF THE DRAWINGS

An exemplary embodiment of the present invention having various refinements and embodiments is illustrated in the drawings and is described in greater detail below.

DETAILED DESCRIPTION OF THE INVENTION

Figure 1:
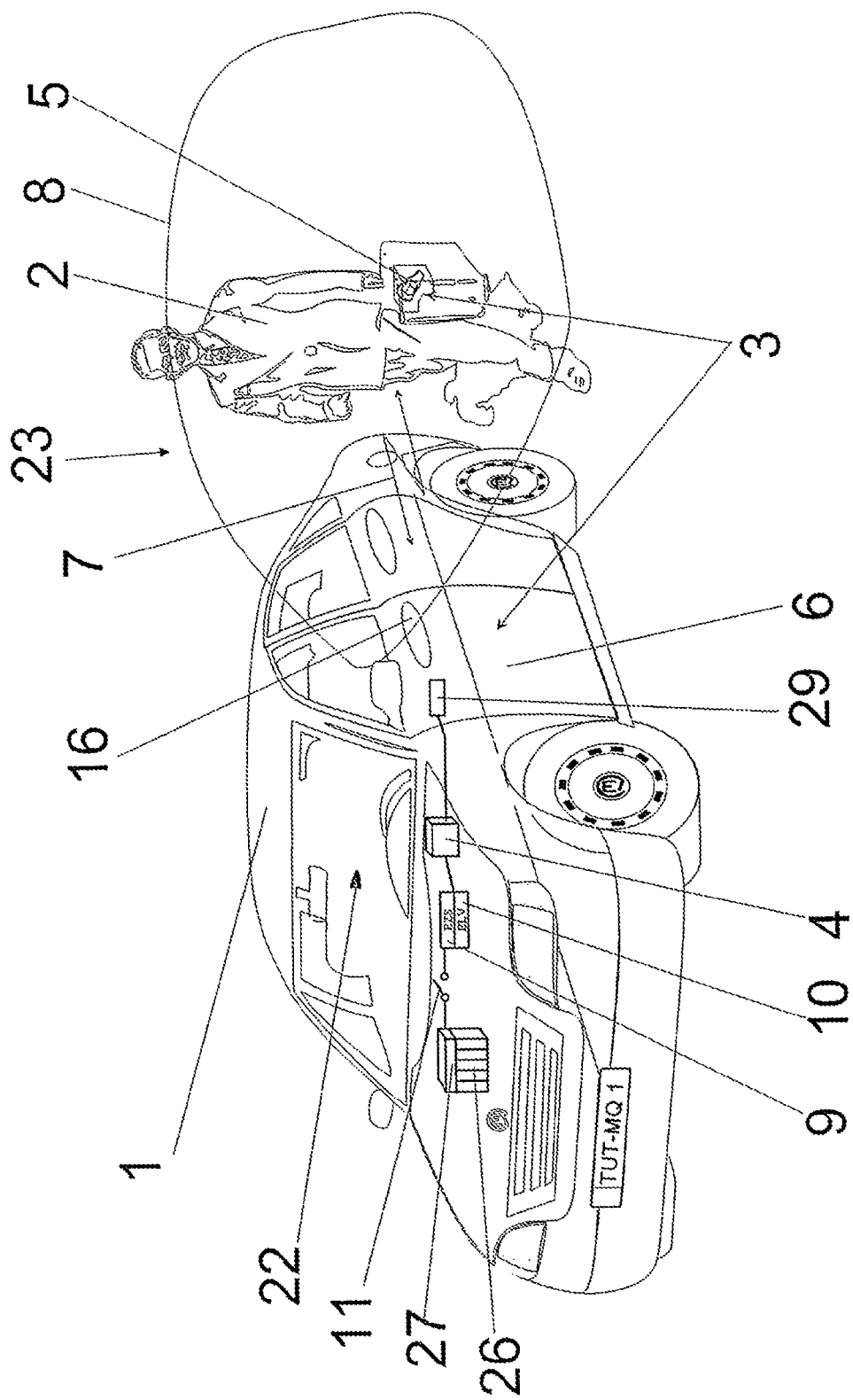
FIG. 1 shows a motor vehicle equipped with a locking system.

FIG. 1 shows a motor vehicle 1 having the authorized user 2. The motor vehicle 1 is provided with a locking system 3 for the access authorization in the form of a door locking system, which includes a first device 4 designed as a control device and an associated second device 5. The second device 5 is designed as a kind of an electronic key, an identification (ID) transmitter, a chip card, a smart card, or the like. The authorized user 2 possesses the second device 5, providing access to the motor vehicle 1 within an effective range 8.

The first device 4 has at least two states, the first state locking the car doors 6 and the second state unlocking them. For their normal operation, the two devices 4, 5 have means for sending and/or receiving signals 7 using an electromagnetic carrier wave. At least one of these signals 7 transmitted between the second device 5 and the first device 4 is an encoded electromagnetic operating signal 15 (see FIG. 2). The encoded operating signal 15 is used for the authentication of the second device 5, whereby a change of the state of the first device 4 is able to be brought about after a positive evaluation of the transmitted operating signal 15 if the second device 5 is authorized. The transmission of the encoded operating signal 15 then takes place if the authorized user 2 operates the door handle 16 on the car door 6 or approaches the door handle 16. The unlocking of the car doors 6 is thus triggered according to the keyless-entry functionality. The transmission of the encoded operating signal 15 may just as well also take place automatically without the involvement of the user 2 when the user 2 enters the effective range 8. However, this will not be examined in greater detail below. If the user 2 closes the car doors 6 from outside, automatic locking of the car doors 6 thus takes place. The automatic locking of the car doors 6 may just as well take place after the user 2 has left the effective range 8.

The locking system 3 also determines the driving authorization for the motor vehicle 1. To do this, the first device 4 that is designed as a control device also causes the unlocking and/or locking of the ignition lock 9 (electronic ignition lock) and/or the steering-wheel lock 10 (electric steering-wheel lock) corresponding to the two states. Another functionally relevant component of the motor vehicle 1 may accordingly be activated just as well by the first device 4. For example, it may bring about an enabling and/or disabling of an immobilizer, the engine control unit, or the like. The transmission of the encoded operating signal 15 for authentication of the second device 5 thus takes place if the authorized user 2 is in the motor vehicle 1 and operates a start/stop switch 11. This triggers the starting procedure or the like of the motor vehicle 1 according to the keyless-go functionality.

The transmission of the signals 7 for the keyless-entry/go functionality is triggered by the operation of a switch and/or a sensor by the user 2. The access authorization may, for example, involve the manual operation of the door handle 16, the rear handle, or the like. The start/stop switch 11, which is able to be operated manually by the user 2, is located in the motor vehicle 1 for the driving authorization. The start/stop switch 11 is advantageously situated in the motor vehicle 1 on the gear selector lever, on the ignition lock 9, in the dashboard, in the central console, or the like.

The functionality of the locking system 3 according to the present invention will now be explained in greater detail with the aid of FIG. 2.

First, the first device 4 sends a first electromagnetic signal 12, which is referred to as a wake-up signal for the associated second device 5, via a transmitter/receiver 24 as a means of sending and/or receiving signals. The second device 5 is transferred from a quiescent state having reduced energy consumption to an activated state for normal operation by the wake-up signal 12. The first device 4 then sends at least one additional, third electromagnetic signal 13, which is also referred to as a range delimitation signal below. The associated second device 5 is thus able to determine its location in relation to the first device 4. In particular, it is possible to determine whether the second device 5 is located on the outside of the motor vehicle 1 and if necessary, the place at which it is located in the exterior space 23 and/or in the interior space 22 of the motor vehicle 1. The second device 5 then sends a fourth signal 14 containing the information about the ascertained location, which is also referred to below as a reply signal, to the first device 4 via a transmitter/receiver 17. Finally, as already described, the fifth electromagnetic signal is then transmitted between the first and the second device 4, 5 as an encoded electromagnetic operating signal 15 for authentication via the transmitter/receiver 24, 17. The signal 15 may be in particular made up of multiple partial signals and transmitted in a bidirectional communication between the two devices 4, 5. Reference is made to DE 43 40 260 A1 regarding further details about bidirectional communication per se.

The wake-up signal 12 may, for example, contain an identifier for the motor vehicle type. After reception of the wake-up signal 12, all second devices 5 located in the effective range 8 that belong to the same motor vehicle type are first activated. In an additional embodiment of the locking system 3, the first device 4 sends a second electromagnetic signal 25 between the first signal 12 and the third signal 13 to the second device 5 as a selection signal, as can be seen in greater detail with the aid of FIG. 2. The second signal 25 contains detailed information about the identity of the motor vehicle 1. Thus, only the second devices 5 actually associated with the first device 4 remain in the activated state. However, second devices in the activated state that are not associated with the motor vehicle 1 are returned to the quiescent state.

Figure 2:
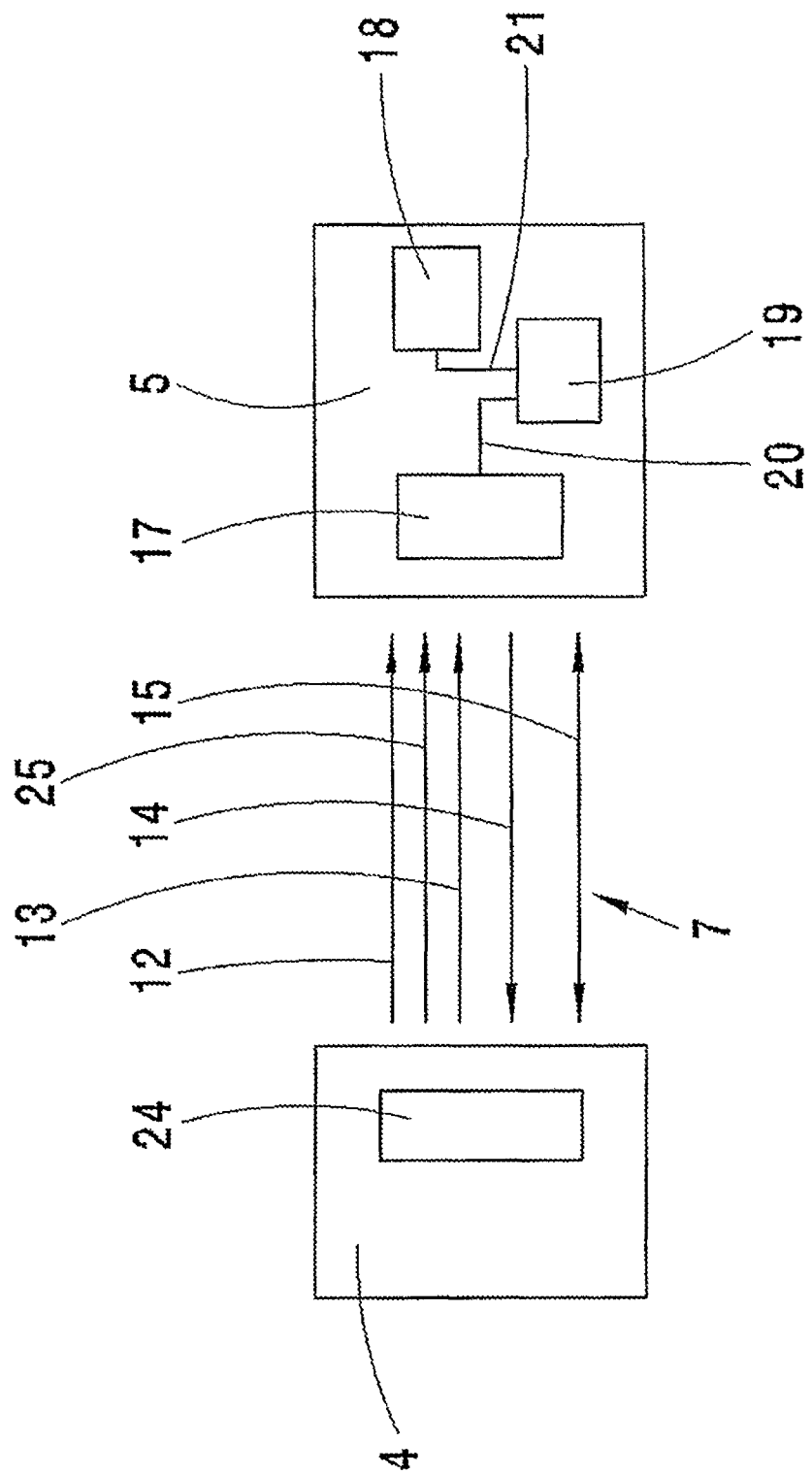
FIG. 2 shows a schematic block diagram of the locking system with a diagram for transmitting the signals, and FIG. 3 schematically illustrates an energy supply circuit for electric components in the motor vehicle.

The second device 5, which is shown as a schematic block diagram in FIG. 2, has the transmitter/receiver 17 as a means of sending and/or receiving signals and a logic circuit 18 that, for example, is made up of a microcomputer. In addition, a means 19 for measuring the field strength at least of one signal transmitted by the first device 4 is situated in the second device 5. The means 19 for measuring the field strength measures the field strength or the intensity of one of the transmitted signals, namely, of the range delimitation signal 13. The means 19 for measuring the field strength is advantageously designed as an integrated component, which is also referred to below as an RSS (radio signal strength) chip. The RSS chip 19 has an input 20, which is connected to the transmitter/receiver 17, and an RSSI (radio signal strength indicator) output 21, which in turn is connected to the logic circuit 18. The RSS chip 19 receives each signal 13 received by the transmitter/receiver 17 via the input 20 and generates an RSSI signal at its RSSI output 21 that is functionally dependent on the field strength of the signal 13.

For example, the RSSI signal may be proportionally or logarithmically dependent on the field strength of the signal 13. It is then possible to perform a determination of the location in the logic circuit 18 via a corresponding evaluation of the RSSI signal.

It is particularly preferred that the carrier wave for the first signal 12 as a wake-up signal and/or for the third signal 13 as a range delimitation signal has a frequency lying in the inductive low-frequency (LF) range. For example, this frequency may be approximately 20 kHz, 120 kHz, 125 kHz, or the like. Such an inductive signal advantageously has a range that is limited to the immediate surroundings of the motor vehicle 1. The second device 5 is thus activated only if it is located in the interior space 22 of the motor vehicle 1 or in the effective range 8 in the exterior space 23 of the motor vehicle 1, thereby avoiding interference and/or security vulnerabilities due to overshoot. If desired, the second signal 25, which is shown in FIG. 2, may also have a frequency lying in the low-frequency (LF) range. However, it is particularly preferred that the carrier wave for the second signal 25 as a selection signal and/or for the fourth signal 14 as a reply signal and/or for the fifth signal 15 as an operating signal has a frequency lying in the higher-frequency (RF) range. For example, this frequency may be approximately 315 MHz, 433 MHz, 868 MHz, or the like.

As also shown in FIG. 1, the motor vehicle 1 has an accumulator 26, which is also commonly referred to as a battery. The accumulator 26 may be a lithium-ion battery, which is characterized by exceptional performance. The accumulator 26 supplies various electric components in the motor vehicle 1 with energy for their operation. For this purpose, an energy supply circuit 27 as a kind of electronics is located in the accumulator 26, via which the electric components are supplied with electric voltage and/or electric current. In particular, the first device 4 in the motor vehicle is also supplied with energy from the accumulator 26 for its normal operation. A discharge monitoring circuit 28 in the current supply circuit 27 shown schematically in FIG. 3 monitors the energy stored in the accumulator 26. If the energy stored in the accumulator 26 falls below a threshold value, the discharge monitoring circuit 28 switches off the voltage and/or current supply at least of individual components in the motor vehicle 1. In this case, the voltage supply of all components may preferably be switched off.

If the voltage and/or current supply is switched off due to a low level of energy in the accumulator 26, the residual energy contained in the accumulator 26 may be provided to a component upon request, in order to enable emergency operation for the motor vehicle 1. The component to which the residual energy is provided is a component of the locking system 3, in particular of the first device 4. Namely, this component of the first device 4 that is supplied with the residual energy is the module 30 for the driving authorization system and/or for the access authorization system. For example, the module 30 for the access authorization system is arranged in the electric door lock for the car door 6 and the module 30 for the driving authorization system is arranged in the engine compartment of the motor vehicle 1.

Figure 3:
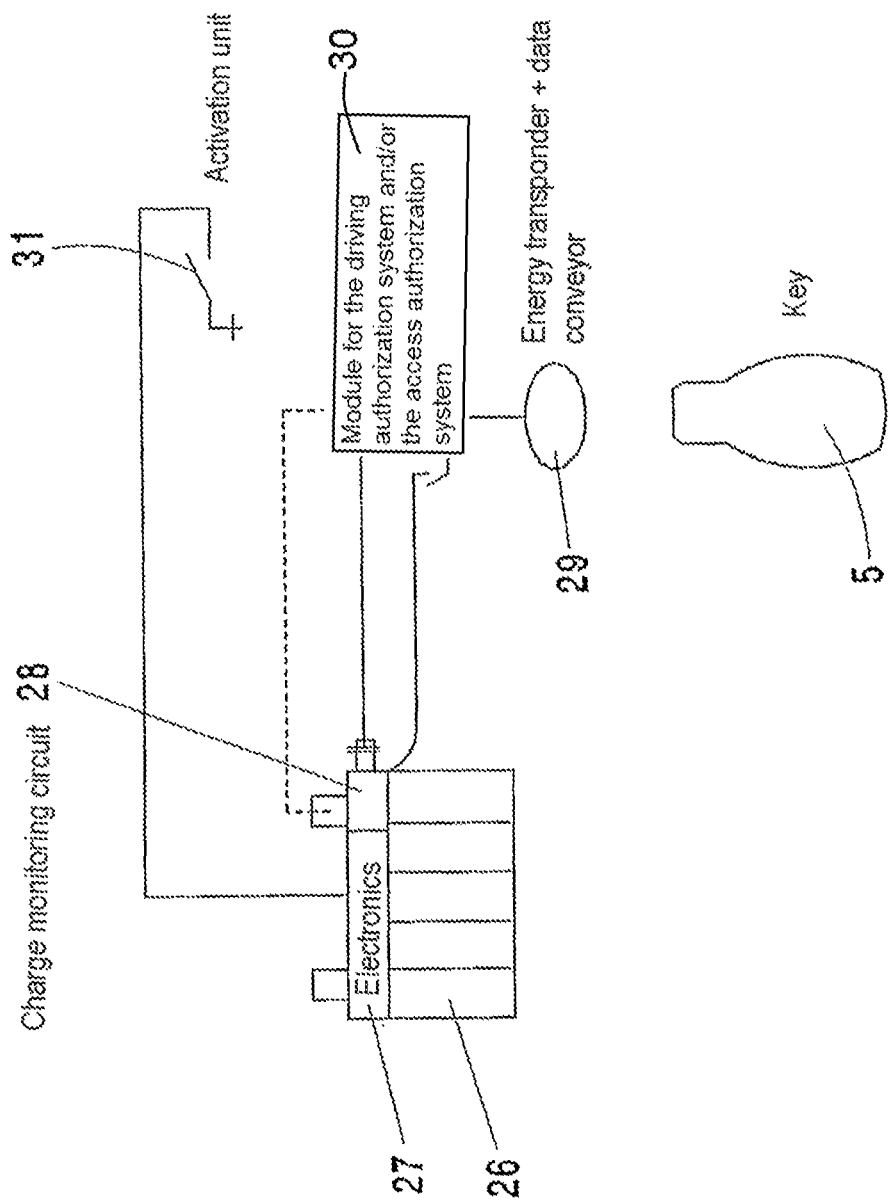

As FIG. 3 also shows, the second device 5, i.e., the electronic key, is activated using the residual energy via the driving authorization system module 30 for the access authorization system with the aid of a transponder 29. The coil of the transponder 29 may be placed in the door handle 16 or, corresponding to FIG. 1, also in another location in the exterior area of the motor vehicle 1. The previously required mechanical lock in the car door 6 for the emergency opening of the motor vehicle 1 is thus now eliminated, since, by appropriately selecting the threshold value for the energy stored in the accumulator 26, the residual energy is sufficient for multiple opening procedures of the car door 6, thus maintaining access to the motor vehicle 1 for the user 2.

Furthermore, it may be desired that in addition to access to the motor vehicle 1 in the event of an emergency, emergency operation of the motor vehicle 1 is also made possible. To do this, the residual energy of the accumulator 26 may be connected via a separate activation unit 31 for operating the vehicle electronics. This makes it possible for the user 2 to carry out at least one starting procedure for the motor vehicle 1. Of course, by appropriately determining the threshold value for the energy stored in the accumulator 26, the residual energy may be measured in such a way that multiple starting procedures are able to be carried out for the motor vehicle 1.

For carrying out the starting procedure in the event of an emergency, the component of the first device 4 that is supplied with the residual energy may then be the control unit for the driving authorization system, i.e., the module 30 for the driving authorization system. The second device 5, i.e., the key, is then activated using the residual energy via the module 30 for the driving authorization system with the aid of a transponder 29. The coil of the transponder 29 may be placed in the dashboard or in another location in the interior area of the motor vehicle 1, which, however, is not shown further.

The present invention is not limited to the described and illustrated exemplary embodiment. Rather, it also includes all refinements by those skilled in the art within the context of the protective claims. A locking system of this kind may thus not only be used in the motor vehicle. A use is also possible for any other door lock that is located, for example, on real property or the like. Finally, the energy supply circuit may also be used for the current and/or voltage supply of other components in electrical systems and electric machines, in domestic electrical installations, or the like, in which the current and/or voltage supply at least of individual components is switched off if the energy stored in the accumulator falls below a threshold value. In such an emergency, the residual energy contained in the accumulator may then be provided appropriately to one component or multiple components upon request.

LIST OF REFERENCE NUMERALS

1: Motor vehicle/vehicle
2: (Authorized) user
3: Locking system
4: First device
5: Second device
6: Car door/door
7: Signal
8: Effective range
9: Ignition lock
10: Steering-wheel lock
11: Start/stop switch
12: (First) signal/wake-up signal
13: (Third) signal/range delimitation signal
14: (Fourth) signal/reply signal
15: (Fifth) signal/(encoded) operating signal
16: Door handle
17: Transmitter/receiver (in the second device)
18: Logic circuit/microprocessor
19: Means for measuring the field strength/RSS chip
20: Input (of RSS chip)
21: RSSI output (on RSS chip)

22: Interior space (of motor vehicle)
23: Exterior space (of motor vehicle)
24: Transmitter/receiver (in the first device)
25: (Second) signal/selection signal
26: Accumulator
27: Energy supply circuit
28: Discharge monitoring circuit
29: Transponder
30: Module/driving authorization system module
31: Activation unit

The invention claimed is:

1. An energy supply circuit comprising:
a rechargeable battery; and
a discharge monitoring circuit,
the rechargeable battery configured to supply electricity to electronic components in a motor vehicle,
the discharge monitoring circuit configured to monitor a level of stored energy stored in the rechargeable battery,
and to switch off energy supply to all said electronic components upon said level of stored energy falling below a threshold energy value,
the discharge monitoring circuit also configured to switch back on energy supply from the rechargeable battery to a locking system component of a locking system of the motor vehicle.

2. An energy supply circuit according to claim 1, wherein the locking system comprises a first device and a second device, the first device a control device that has at least two states, each of the first and second devices comprising at least one of an electromagnetic signal transmitter and an electromagnetic signal receiver, the first device and the second device configured to transmit between the first device and the second device a coded operational signal for the authentication of the second device, so that after a positive evaluation of the transmitted operational signal in the case of the authorized second device, a change in the state of the first device can be effected, and wherein said first device comprises said locking system component, to which residual energy stored in the rechargeable battery is made available to said locking system component upon receipt of a positively evaluated electromagnetic signal that indicates a request that residual energy be made available to said locking system component.

3. An energy supply circuit according to claim 2, wherein said first device comprises a module of a system that selectively authorizes at least one of driving and access, and said module comprises said locking system component.

4. An energy supply circuit according to claim 3, wherein said second device is actuated by a transponder via the module.

5. An energy supply circuit according to claim 4, wherein the transponder comprises a coil, said coil placed in an outer area of the motor vehicle.

6. An energy supply circuit according to claim 2, wherein said first device further comprises a control device that is configured to selectively authorize driving, and residual energy stored in the rechargeable battery is made available upon receipt of a positively evaluated electromagnetic signal that indicates a request that said control device authorize driving.

7. An energy supply circuit according to claim 6, wherein the second device is actuated by a transponder via the control device that authorizes driving.

8. An energy supply circuit according to claim 7, wherein the transponder comprises a coil, said coil placed in an interior area of the motor vehicle.

9. An energy supply circuit according to claim 2, wherein said first device is a control device that controls at least one of: door locks, an ignition lock, a steering wheel lock, a vehicle immobilizer, and an engine control unit.

10. An energy supply circuit according to claim 2, wherein said second device is selected from among an electronic key, an ID transmitter and a chip card.

11. An energy supply circuit according to claim 2, wherein a component to which the discharge monitoring circuit is configured to switch back on energy supply from the rechargeable battery is a component of the first device.

12. An energy supply circuit according to claim 1, wherein energy supply from the rechargeable battery can be switched back on via an activation unit for operation of electronics of the motor vehicle, so that at least one start process can be carried out for the motor vehicle.

13. An energy supply circuit according to claim 1, wherein the rechargeable battery is a Li-ion battery.

14. An energy supply circuit according to claim 1, wherein a component to which the discharge monitoring circuit is configured to switch back on energy supply from the rechargeable battery is a module in a door of the motor vehicle.

15. An energy supply circuit comprising:
a rechargeable battery; and
a discharge monitoring circuit,
the rechargeable battery configured to supply electricity to electronic components in a motor vehicle,
the discharge monitoring circuit configured to monitor a level of stored energy stored in the rechargeable battery, and to switch off energy supply to at least some of said electronic components upon said level of stored energy falling below a threshold energy value,
the discharge monitoring circuit also configured to switch back on energy supply to only one or more components selected from among components that control door locks of the motor vehicle, components that control an ignition lock of the motor vehicle, components that control a steering wheel lock of the motor vehicle, and components that control an engine of the motor vehicle.

* * * * *

UNITED STATES PATENT AND TRADEMARK OFFICE
CERTIFICATE OF CORRECTION

PATENT NO. : 9,789,830 B2
APPLICATION NO. : 14/163369
DATED : October 17, 2017
INVENTOR(S) : Karl Müller and Matthias Reckermann It is certified that error appears in the above-identified patent and that said Letters Patent is hereby corrected as shown below:

On the Title Page

Related U.S. Application Data
Please add: (63) Related U.S. Application Data: Continuation of application PCT/EP2012/003162, filed on July 26, 2012

Signed and Sealed this
Twentieth Day of February, 2018

Andrei Iancu
*Director of the United States Patent and Trademark Office*